United States Patent
Ito

(10) Patent No.: US 12,272,582 B2
(45) Date of Patent: Apr. 8, 2025

(54) OVERHEAD CONVEYANCE SYSTEM

(71) Applicant: MURATA MACHINERY, LTD., Kyoto (JP)

(72) Inventor: Yasuhisa Ito, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 164 days.

(21) Appl. No.: 17/922,807

(22) PCT Filed: Feb. 15, 2021

(86) PCT No.: PCT/JP2021/005480
§ 371 (c)(1),
(2) Date: Nov. 2, 2022

(87) PCT Pub. No.: WO2021/235029
PCT Pub. Date: Nov. 25, 2021

(65) Prior Publication Data
US 2023/0170238 A1     Jun. 1, 2023

(30) Foreign Application Priority Data
May 19, 2020   (JP) .................. 2020-087270

(51) Int. Cl.
*H01L 21/60*      (2006.01)
*B66C 19/00*     (2006.01)
(Continued)

(52) U.S. Cl.
CPC ........ *H01L 21/67733* (2013.01); *B66C 19/00* (2013.01); *H01L 21/67724* (2013.01); *B65G 1/0464* (2013.01); *H01L 21/6773* (2013.01)

(58) Field of Classification Search
CPC ......... H01L 21/67724; H01L 21/67706; H01L 21/67715; B66C 9/04; B66C 17/06; B66C 19/00; B61B 3/02; B65G 1/0457
See application file for complete search history.

(56) References Cited

U.S. PATENT DOCUMENTS

2013/0061772 A1    3/2013  Chen et al.
2013/0213755 A1    8/2013  Shibata et al.
(Continued)

FOREIGN PATENT DOCUMENTS

| CN | 102460675 A | * | 5/2012 | ........... B65G 1/0407 |
| JP | H08324772 A |   | 12/1996 | |

(Continued)

OTHER PUBLICATIONS

Official Communication issued in International Patent Application No. PCT/JP2021/005480, mailed on Apr. 27, 2021.
(Continued)

*Primary Examiner* — Emmanuel M Marcelo
(74) *Attorney, Agent, or Firm* — Keating & Bennett, LLP

(57) ABSTRACT

An overhead transport system includes an overhead transport vehicle including a conveyor and a body, and a controller. The conveyor includes wheels to travel on rails including straight rails and intersection rails alternately arranged with a gap in each of a first direction and a second direction perpendicular to the first direction. The controller is configured or programmed to execute steering control to steer the wheels in a state in which each of the wheels is positioned on one of the intersection rails different from one another. A steering center of the wheel under the steering control is on the intersection rail and inward of the body from a ground contact point of the wheel on the intersection rail.

5 Claims, 10 Drawing Sheets

(51) Int. Cl.
*H01L 21/677* (2006.01)
*B65G 1/04* (2006.01)

(56) References Cited

U.S. PATENT DOCUMENTS

| | | | | |
|---|---|---|---|---|
| 2015/0131070 A1* | 5/2015 | Tung | .................. | G03F 7/70741 |
| | | | | 355/72 |
| 2016/0152450 A1* | 6/2016 | Murakami | ................ | B66C 9/04 |
| | | | | 212/328 |
| 2019/0067065 A1* | 2/2019 | Chang | ............... | H01L 21/67733 |
| 2019/0189488 A1 | 6/2019 | Ito | | |
| 2020/0105563 A1* | 4/2020 | Chang | ............... | H01L 21/67225 |

FOREIGN PATENT DOCUMENTS

| | | | |
|---|---|---|---|
| WO | 2018/037762 A1 | 3/2018 | |
| WO | 2020090253 A1 | 5/2020 | |
| WO | WO-2020180505 A1 * | 9/2020 | ........... B65G 47/902 |

OTHER PUBLICATIONS

Official Communication issued in corresponding Singaporean Patent Application No. 11202260186Q, mailed on Dec. 19, 2024, 8 pages.

* cited by examiner

Fig. 4A
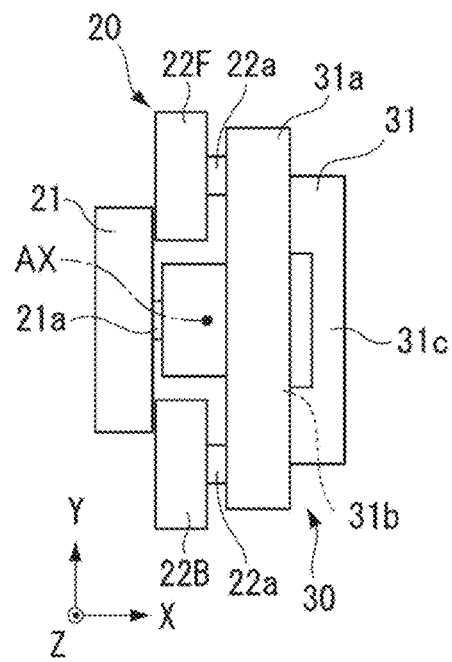
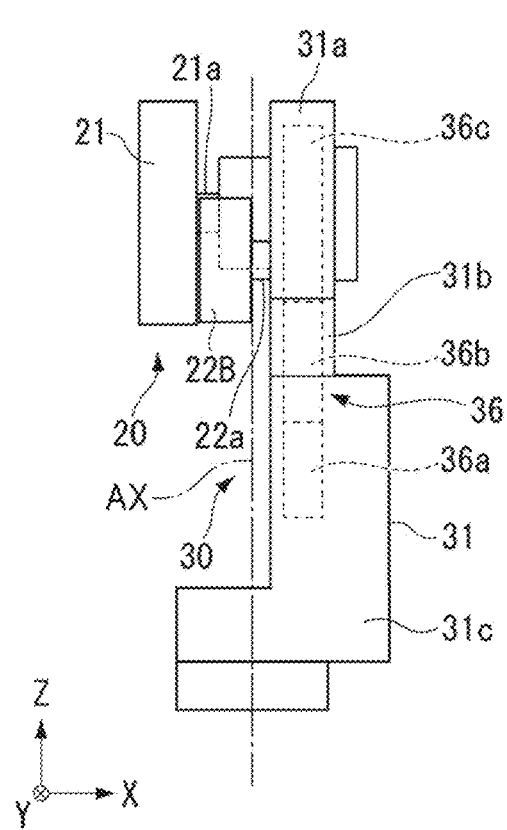
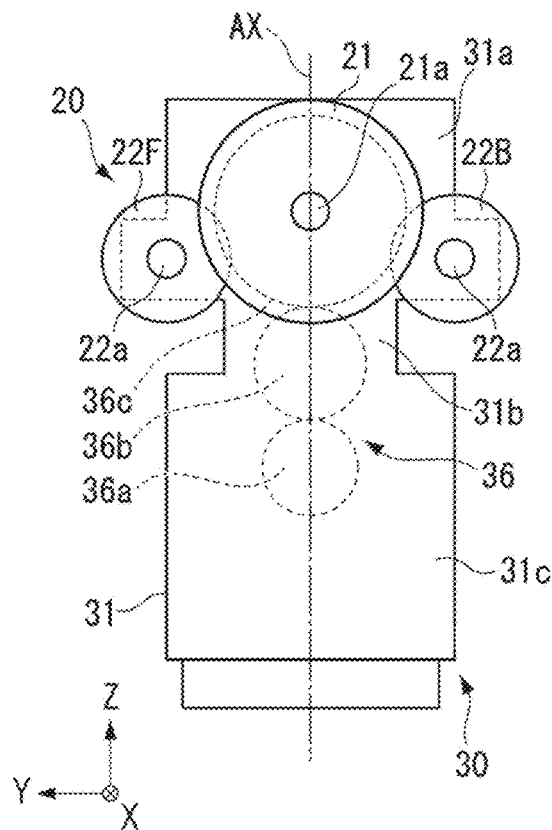
Fig. 4B          Fig. 4C

OVERHEAD CONVEYANCE SYSTEM

BACKGROUND OF THE INVENTION

1. Field of the Invention

One aspect of the present invention relates to an overhead transport system.

2. Description of the Related Art

There has been known an overhead transport system that includes an overhead transport vehicle having a traveling unit configured to travel on rails arranged in a grid pattern and a body section suspended from the traveling unit and holding articles below the rails, and a control unit configured to control the operation of the overhead transport vehicle. For example, in the overhead transport system described in International Publication No. WO 2018/037762, the traveling unit includes traveling wheels provided to be steerable at each of the four corners of the body section.

SUMMARY OF THE INVENTION

In the above-described overhead transport system, the rails include a plurality of straight rails and a plurality of intersection rails, and the straight rails and the intersection rails are alternately arranged with a gap in each of a first direction and a second direction perpendicular to the first direction. In such an overhead transport system, vibration may occur not only during travel time but also during steering operation for steering the traveling wheels, due to the traveling wheels falling into the relevant gap.

Preferred embodiments of the present invention provide overhead transport systems each capable of reducing or preventing vibrations during steering operation.

An overhead transport system according to one aspect of a preferred embodiment of the present invention includes an overhead transport vehicle including a conveyor to travel on rails arranged at least partly in a grid pattern and a body suspended from the conveyor to hold articles below the rails, and a controller configured or programmed to control operations of the overhead transport vehicle, wherein the conveyor includes wheels each being steerable at each of four corners of the body, the rails include a plurality of straight rails and a plurality of intersection rails alternately arranged with a gap in each of a first direction and a second direction perpendicular to the first direction, the controller is configured or programmed to execute steering control to steer the wheels in a state in which each of the wheels is positioned on one of the intersection rails different from one another, and a steering center of the wheel under the steering control is on the intersection rail and inward of the body from a ground contact point of the wheel on the intersection rail.

In this overhead transport system, during a steering operation to steer the wheel, it is no longer needed to roll the wheel so as to straddle a gap between the straight rail and the intersection rail, and the wheel does not fall into the gap. Thus, the vibration during a steering operation can be reduced or prevented.

In an overhead transport system according to one aspect of a preferred embodiment of the present invention, the conveyor may include an auxiliary wheel arranged on at least one of the front side and the rear side in a traveling direction with respect to each of the wheels. In this configuration, in a travel time during which the overhead transport vehicle travels linearly in the first direction or the second direction along the rails, the wheel can be prevented from falling into the gap by the auxiliary wheels, and vibration can be reduced or prevented.

In an overhead transport system according to one aspect of a preferred embodiment of the present invention, a lower end of the auxiliary wheel may be higher than a lower end of the wheel, and an end portion of the straight rail may include a raised portion on which the auxiliary wheel is able to ride and that has a height corresponding to a difference between the lower end of the auxiliary wheel and the lower end of the wheel. In this configuration, in a travel time during which the overhead transport vehicle travels linearly in the first direction or the second direction along the rails, while the wheel is prevented from falling into the gap by the auxiliary wheels and the raised portion, the auxiliary wheels can be prevented from contacting the rail and the raised portion when the wheel is in contact with the rail, and wearing of the auxiliary wheel can be reduced or prevented.

In an overhead transport system according to one aspect of a preferred embodiment of the present invention, the auxiliary wheels may be at a position deviating from the raised portion during the execution of steering control. In this configuration, the auxiliary wheel can be prevented from contacting the raised portion during steering, and wearing of the auxiliary wheel can be reduced or prevented.

According to various preferred embodiments of the present invention, overhead transport systems capable of reducing or preventing vibrations during steering operation can be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4A is an enlarged plan view illustrating a traveling unit and a coupling section in FIG. 1. FIG. 4B is an enlarged front view illustrating the traveling unit and the coupling section in FIG. 1. FIG. 4C is an enlarged side view illustrating the traveling unit and the coupling section in FIG. 1.

DETAILED DESCRIPTION OF THE PREFERRED EMBODIMENTS

Figure 1:
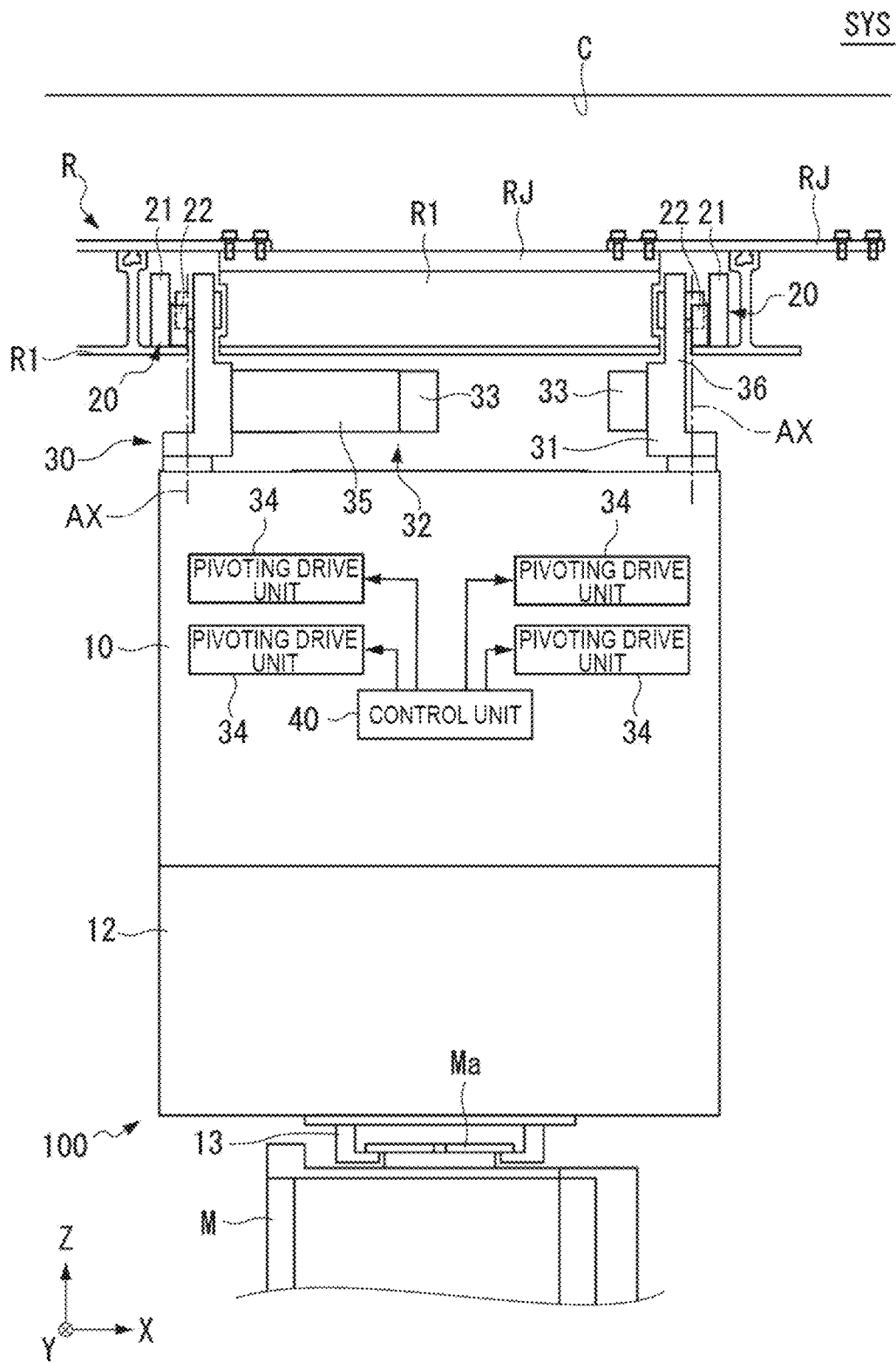
FIG. 1 is a front view illustrating a portion of an overhead transport system according to a preferred embodiment of the present invention.

Preferred embodiments will now be described with reference to the drawings. In the drawings, for the sake of convenience, the scale is changed for expression, as appropriate, such as by illustrating a portion in an enlarged or emphasized manner.

In each drawing, directions in the drawing are illustrated with the XYZ-coordinate system. In the XYZ-coordinate system, a plane parallel to the horizontal plane is defined as an XY plane. A linear direction that is a traveling direction of an overhead transport vehicle 100 in the XY plane is denoted as the Y direction for the sake of convenience, and a direction orthogonal to the Y direction is denoted as the X direction. The direction perpendicular to the XY plane is denoted as the Z direction. Each of the X direction, the Y direction, and the Z direction is described on the assumption that the direction of the arrow on the coordinate axis in the drawing is the + direction and the direction opposite to the direction of the arrow is the − direction. The direction of rotation with the Z direction as an axis is denoted as θZ direction.

Figure 2:
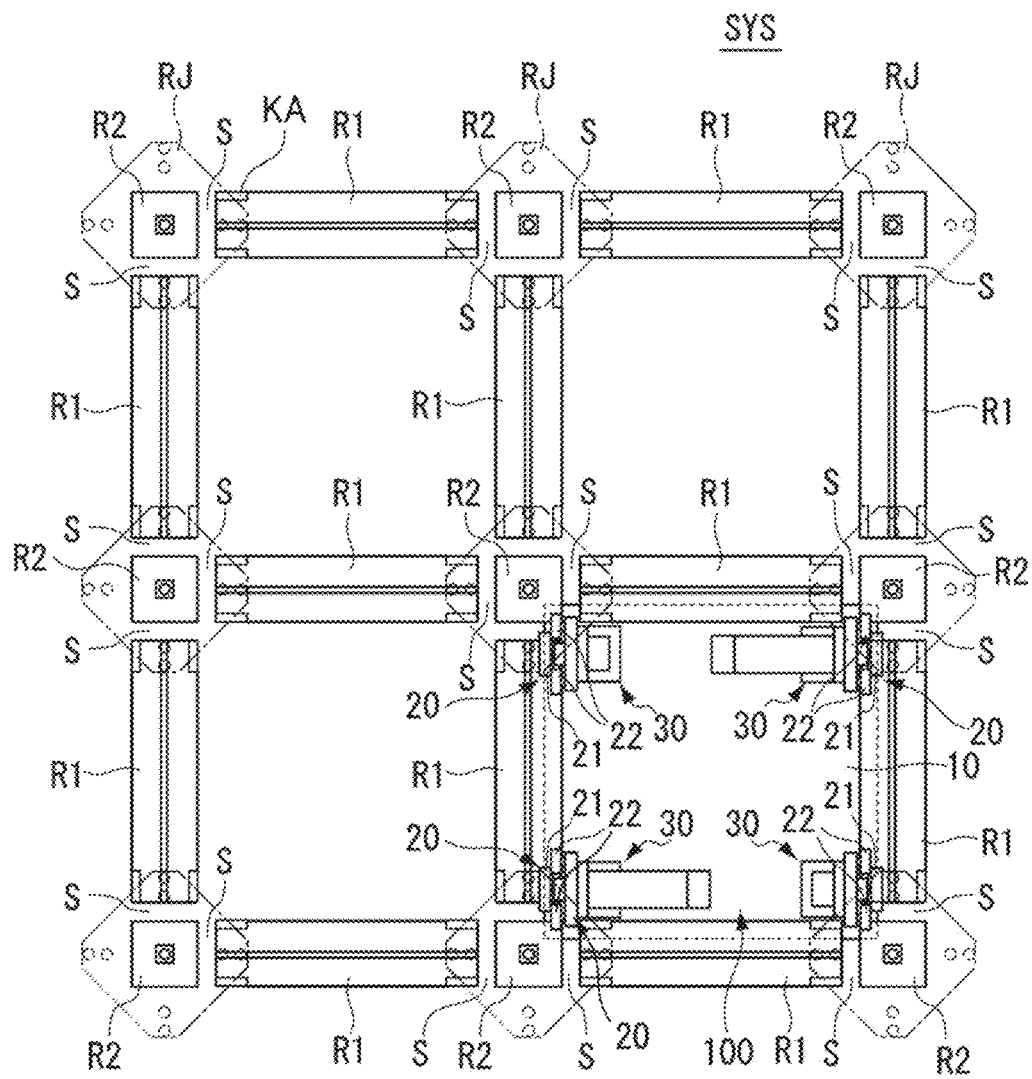
FIG. 2 is a plan view illustrating a portion of the overhead transport system in FIG. 1.

FIG. 1 is a front view illustrating an overhead transport system SYS. FIG. 2 is a plan view illustrating a portion of the overhead transport system SYS. As illustrated in FIG. 1 and FIG. 2, the overhead transport system SYS is a system that transports transport containers M, such as FOUPs that contain semiconductor wafers or reticle pods that contain reticles, as articles in a clean room of a semiconductor manufacturing plant, for example. The overhead transport system SYS is equipped with rails R and the overhead transport vehicle 100.

The rails R may be installed near the ceiling of a building such as a clean room. The rails R are fixed in a state of being suspended from the ceiling C by fixing members not depicted. The rails R are arranged at least partially in a grid pattern. The rails R have a plurality of straight rails R1 and a plurality of intersection rails R2. The straight rails R1 and the intersection rails R2 are alternately arranged with a gap S in each of the X direction (first direction) and the Y direction (second direction).

At the intersection of the rails R, the straight rail R1 is placed on each of the +X side, −X side, +Y side, and −Y side of one intersection rail R2, and such arrangement is repeated in the X direction and the Y direction. The straight rail R1 and the intersection rail R2 are coupled at the upper side of the rails R by a coupling mechanism such as a rail joint RJ. The gap S formed between the straight rail R1 and the intersection rail R2 is a portion through which a coupling section 30 passes when the overhead transport vehicle 100 travels. At the end portions in the longitudinal direction of the straight rail R1, raised portions KA which will be described later are provided. For the convenience of explanation, the raised portions KA are omitted in FIG. 1 and FIG. 3.

The overhead transport vehicle 100 has a body section 10 (body), a traveling unit 20 (conveyor), a coupling section 30, and a control unit 40 (controller). The overhead transport vehicle 100 travels along the rails R and transports the transport container M. The overhead transport vehicle 100 is not limited to one in the overhead transport system SYS, and a plurality of carriers may be used. Transporting the transport container M by each of the overhead transport vehicles 100 enables high-density transportation.

The body section 10 is disposed below (e.g., on the −Z side) the rails R. The body section 10 is formed in a rectangular shape having four corners in plan view. The body section 10 is formed in a size that fits within one section of the grid-shaped rails R in plan view. Therefore, passing by another overhead transport vehicle 100 traveling on an adjacent rail R is possible, and when a plurality of overhead transport vehicles 100 are placed on the rails R, the range in which each overhead transport vehicle 100 can travel without interfering with each other can be expanded. The body section 10 is suspended from the traveling unit 20.

The body section 10 has a transfer device 12. The transfer device 12 can hold the transport container M below the rail R and transfer the transport container M to a predetermined placement location below the rail R. The transfer device 12 includes a gripping section 13 that grips a flange Ma of the transport container M, and suspends and holds the transport container M. The gripping section 13 is connected to suspending members such as a plurality of belts or ropes. The transfer device 12 raises and lowers the gripping section 13 by feeding out or winding up these suspending members with a hoist or the like not depicted, and transfers the transport container M to and from a shelf section 15 (see FIG. 3) of or a loading/unloading section of a storage device 14 arranged below the rail R, or a loading/unloading section of a processing device or the like.

Figure 3:
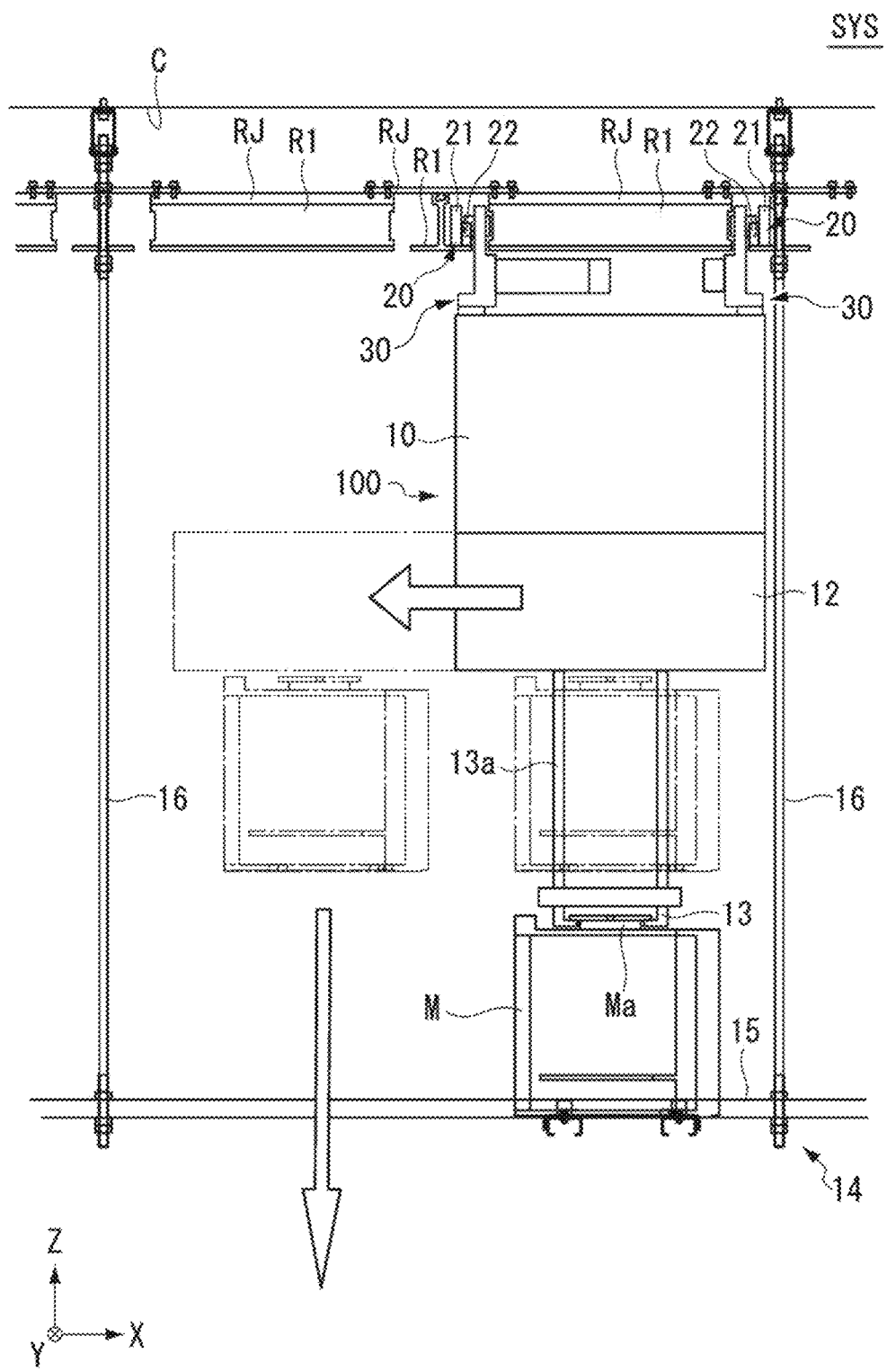
FIG. 3 is a front view illustrating an example of transferring a transport container by an overhead transport vehicle in FIG. 1.

FIG. 3 is a front view illustrating an example of transferring the transport container M by the overhead transport vehicle 100. As illustrated in FIG. 3, the transport container M is transferred between the overhead transport vehicle 100 and the shelf section 15 of the storage device 14. The storage device 14 is arranged below the traveling path of the overhead transport vehicle 100 and includes the shelf section 15 and suspending rods 16. The shelf section 15 is suspended from the ceiling C by the suspending rods 16. The shelf section 15 is provided with a plurality of protruding pins not depicted, and when the transport container M is placed on the shelf section 15, the pins enter into grooves provided on the bottom surface of the transport container M and position the transport container M.

The storage device 14 illustrated is a storage device for the temporary storage of the transport container M arranged in a suspended structure below the traveling path of the overhead transport vehicle 100. The storage device 14 is not limited to the structure illustrated and may be a storage device installed on the floor and vertically having a plurality of shelves for placing, a storage device installed near a processing device to temporarily store the transport container M, or the like, for example.

The transfer device 12 may include a lateral extension mechanism that moves the transport container M in the horizontal direction (X direction or Y direction). By driving the lateral extension mechanism, the transfer device 12 protrudes in the horizontal direction from the body section 10. Accordingly, even if the transfer location of the transport container M is displaced from below the body section 10, the transfer device 12 can be positioned above the transfer location by the lateral extension mechanism and raising and lowering the transport container M after the lateral extension of the transfer device 12 makes it possible to transfer the transport container M to and from the transfer location displaced from below the body section 10. The transfer device 12 may include a rotation mechanism that rotates the transport container M held therein about the vertical direction.

As illustrated in FIG. 1 and FIG. 2, the traveling unit 20 travels on the rails R. The traveling unit 20 has traveling wheels 21 and the auxiliary wheels 22. The traveling wheels 21 are steerable (pivotable) at each of the four corners of the body section 10. The traveling wheel 21 comes into contact with the rails R including the straight rail R1 and the intersection rail R2. The outer diameter of the traveling wheel 21 is set greater than the length of the gap S. The traveling wheel 21 is rotatively supported by the coupling section 30 described later. The traveling wheel 21 may have a non-slip finish for which rubber or other material is applied to the peripheral surface that comes into contact with the rails R.

The auxiliary wheels 22 are arranged one by one on the front side and the rear side in the traveling direction with respect to the traveling wheel 21. Hereinafter, when the front and rear auxiliary wheels 22 are described distinctly, the auxiliary wheel 22 arranged on the front side of the traveling wheel 21 is described as the front auxiliary wheel 22F and the auxiliary wheel 22 arranged on the rear side of the traveling wheel 21 is described as the rear auxiliary wheel 22B. The two auxiliary wheels 22 are, as with the traveling wheel 21, each rotatively supported by the coupling section 30 described later. The rotation axes of the two auxiliary wheels 22 are parallel to each other but are not limited thereto and may be not parallel to each other.

The two auxiliary wheels 22 are arranged in front of and behind the traveling wheel 21 in the traveling direction, so that these traveling wheel 21 and the two auxiliary wheels 22 are in a state of being arranged side by side in the traveling direction. The two auxiliary wheels 22 are each arranged inward from the traveling wheel 21. The auxiliary wheel 22 may have a friction-reducing treatment on the peripheral surface that comes into contact with the rail R. In this case, the auxiliary wheel 22 has a smaller coefficient of friction with respect to the rail R than that of the traveling wheel 21. The interval between the auxiliary wheel 22 and the traveling wheel 21 is set greater than the distance of the gap S. The auxiliary wheel 22 has a smaller diameter relative to the traveling wheel 21. This allows the entire length of the traveling unit 20 to be shortened. The front auxiliary wheel 22F and the rear auxiliary wheel 22B have the same diameter but are not limited thereto and may have diameters different from each other.

The coupling section 30 has a coupling member 31, a traveling drive unit 32, a position detection unit 33, and a pivoting drive unit 34. The coupling members 31 are arranged one by one at each of the four corners of the body section 10. By the coupling member 31, the body section 10 and the traveling wheel 21 (auxiliary wheels 22) are coupled. The coupling member 31 is provided to be steerable in the θZ direction about the pivot axis AX. As the coupling member 31 swivels, the traveling wheel 21 and the auxiliary wheels 22 can swivel in the θZ direction and change the traveling direction.

The traveling drive unit 32 is attached to the coupling member 31. The traveling drive unit 32 drives the traveling wheel 21. The traveling drive unit 32 is attached to the coupling member 31 arranged at two diagonal corners among the four corners. Accordingly, the two traveling wheels 21 of the four traveling wheels 21 driven by the traveling drive units 32 serve as driving wheels. By arranging the driving wheels diagonally, even when one traveling wheel 21 is in the gap S, the other traveling wheel 21 is positioned on the rail R, so that the driving force can be continuously generated.

The traveling drive unit 32 has a drive source 35 such as a motor and a transmission mechanism 36 which will be described later, for example. The output shaft, not depicted, of the drive source 35 is connected to a shaft portion 21a (see FIGS. 4A to 4C) of the traveling wheel 21 via the transmission mechanism 36. The drive source 35 is fixed to the coupling member 31. Accordingly, the drive source 35 swivels integrally in the θZ direction when the coupling member 31 swivels. The drive source 35 is arranged so as to fit, in plan view, within the range of the body section 10. This enables the drive source 35, even when swiveled, to prevent protruding outward from the body section 10. In addition, the two drive sources 35 are, in plan view, arranged point-symmetrically with the center point of the body section 10 as a reference, so that the relatively heavy drive sources 35 can be arranged in the body section 10 in a well-balanced manner.

The position detection unit 33 is attached to the coupling member 31. The position detection unit 33 is connected to the traveling wheel 21 via the transmission mechanism 36. The position detection unit 33 can detect the position of the overhead transport vehicle 100 by detecting the amount of rotation and the like of the traveling wheel 21. The position detection unit 33 is attached, of the four coupling members 31, to the other two coupling members 31 on which the traveling drive unit 32 is not provided. The position detection unit 33 detects the travel distance of the traveling wheel 21 (position of the overhead transport vehicle 100) based on the amount of rotation of the shaft portion 21a of the traveling wheel 21 (see FIGS. 4A to 4C), for example. In addition, the position detection unit 33 is also provided at the end portion of the drive source 35. The position detection unit 33 provided on the drive source 35 detects the rotational position or the like of the output shaft of the drive source 35 or of the traveling wheel 21. As the position detection unit 33, a rotary encoder and the like is used, for example.

The detection result of the position detection unit 33 is sent to the control unit 40 and the like, for example. By complementing the detection results from the two position detection units 33 with each other, even when one traveling wheel 21 is positioned in the gap S and is not rotating, for example, the control unit 40 can accurately detect the position of the overhead transport vehicle 100 by using the detection result from the position detection unit 33 of the other traveling wheel 21.

The pivoting drive unit 34 is provided on the body section 10 for each coupling member 31. The pivoting drive unit 34 has a drive source, not depicted, such as a motor and swivels the coupling member 31 around the pivot axis AX. The pivoting drive unit 34 is controlled by the control unit 40. The pivoting drive unit 34 is not limited to being provided for each coupling member 31 and may be configured to swivel a plurality of coupling members 31 with one pivoting drive unit 34.

The control unit 40 (controller) is a computer made of a central processing unit (CPU), a read only memory (ROM), a random access memory (RAM), and the like. The control unit 40 can be configured as software for which a program stored in the ROM is loaded onto the RAM and executed by the CPU, for example. The control unit 40 may be configured as hardware with an electronic circuit and the like. The control unit 40 may be made up of a single device or may be made up of a plurality of devices. When made up of multiple devices, as those are connected via a communication network such as the Internet or an intranet, one control unit 40 is logically constructed.

The control unit 40 is configured or programmed to control the operation of the overhead transport vehicle 100. The control unit 40 is configured or programmed to comprehensively control the operation of each unit such as the traveling drive unit 32 and the pivoting drive unit 34. The control unit 40 is provided in the body section 10, for example, but may be provided outside the body section 10. In addition, the control unit 40 may control the operation of each unit according to instructions from an external higher-level control device. The control unit 40 executes steering control to steer (swivel) the traveling wheel 21 in the θZ direction around the pivot axis AX in a state in which each of the four traveling wheels 21 is positioned on one of the intersection rails R2 different from one another. In the steering control, the traveling direction of the overhead transport vehicle 100 is changed from the Y direction to the X direction or from the X direction to the Y direction.

FIGS. 4A to 4C are a plan view, a front view, and a side view illustrating, in an enlarged manner, the traveling unit 20 and the coupling section 30. As illustrated in FIGS. 4A to 4C, the traveling wheel 21 of the traveling unit 20 is rotatively provided by the shaft portion 21a along the horizontal direction. The shaft portion 21a is supported by the coupling section 30. The two auxiliary wheels 22 are each rotatively provided by a shaft portion 22a along the horizontal direction. Each shaft portion 22a is supported by the coupling section 30. The shaft portion 22a is arranged parallel to the shaft portion 21a of the traveling wheel 21, but it is not limited thereto and the shaft portion 21a and the shaft portion 22a may be not parallel to each other.

The coupling member 31 of the coupling section 30 has a wheel support portion 31a, an intermediate portion 31b, and a body coupling portion 31c. The wheel support portion 31a is arranged on the lateral side of the rail R. The wheel support portion 31a rotatively supports the shaft portion 21a of the above-described traveling wheel 21 and the shaft portions 22a of the auxiliary wheels 22. The intermediate portion 31b extends downward from the wheel support portion 31a and is formed in a plate shape having a thickness of a shorter dimension than the length of the gap S of the rails R. This intermediate portion 31b allows the coupling section 30 to pass through the gap S. The body coupling portion 31c is arranged below the intermediate portion 31b and is arranged on the −Z side of the rail R. The body coupling portion 31c is coupled to the upper surface of the body section 10 so as to be pivotable in the θZ direction via a bearing (not depicted) with the pivot axis AX as the central axis. Such a coupling member 31 is pivotable in the θZ direction around the pivot axis AX on the body section 10. The coupling member 31 is configured such that the pivot axis AX is close to the edge of the body section 10 in plan view. The coupling member 31 is configured such that, when the steering control is executed, the pivot axis AX is, in plan view, positioned inward the body section 10 from the ground contact point of the traveling wheel 21 on the intersection rail R2 (details will be described later).

The transmission mechanism 36 of the coupling section 30 transmits a driving force generated by the drive source 35 (see FIG. 1). The transmission mechanism 36 has a drive-source side gear 36a, an intermediate gear 36b, and a traveling-wheel side gear 36c. The drive-source side gear 36a, the intermediate gear 36b, and the traveling-wheel side gear 36c are arranged side by side in a straight line in the vertical direction, but the arrangement is not limited thereto. The drive-source side gear 36a is rotatable about a rotation axis along the horizontal direction. The drive-source side gear 36a is connected to the output shaft of the drive source 35 and is meshed with the intermediate gear 36b. The intermediate gear 36b is rotatable about a rotation axis along the horizontal direction and is meshed with the traveling-wheel side gear 36c. The traveling-wheel side gear 36c is connected to the shaft portion 21a of the traveling wheel 21. Therefore, as the output shaft of the drive source 35 rotates, a rotational driving force is transmitted to the traveling wheel 21 at a predetermined reduction ratio via the drive-source side gear 36a, the intermediate gear 36b, and the traveling-wheel side gear 36c. The transmission mechanism 36 is not limited to a configuration in which a plurality of gears are combined as described above, and may be a configuration in which a belt, a chain, or the like is used.

Figure 5:
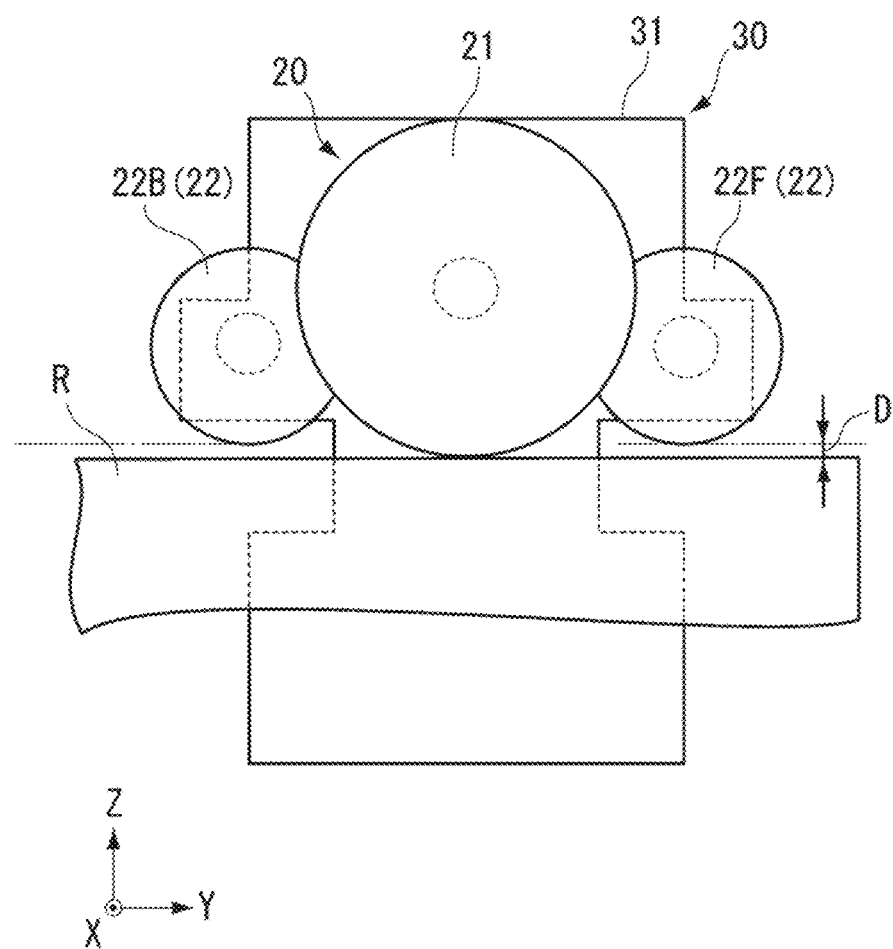
FIG. 5 is a diagram illustrating an example of contact heights of a rail at a traveling wheel and auxiliary wheels in FIG. 1.

FIG. 5 is a diagram illustrating an example of contact heights of the rail R at the traveling wheel 21 and auxiliary wheels 22. As illustrated in FIG. 5, the auxiliary wheel 22 has the contact height with respect to the rail R higher than the contact height of the traveling wheel 21 with respect to the rail R. That is, the lower ends of the auxiliary wheels 22 are positioned at a higher position than the lower end of the traveling wheel 21. As a result, during normal travel, the traveling wheel 21 comes into contact with the rails R, and the auxiliary wheels 22 at that time are in a state in which there is a gap D in the Z direction with respect to the rails R. The gap D corresponds to the difference between the lower end of the auxiliary wheel 22 and the lower end of the traveling wheel 21. The gap D is preferably about 100 μm to about 1 mm, for example, but the size of the gap D can be set optionally.

The gap D of the front auxiliary wheel 22F and the gap D of the rear auxiliary wheel 22B are preferably the same or substantially the same. The diameter of the front auxiliary wheel 22F and the diameter of the rear auxiliary wheel 22B are preferably the same or substantially the same. The auxiliary wheel 22 has a smaller coefficient of friction with respect to the rail R than that of the traveling wheel 21. This makes it easier for the peripheral surface of the auxiliary wheel 22 to move so as to slide on the rail R when the traveling wheel 21 is swiveled, facilitating the change in the traveling direction of the traveling wheel 21.

Figure 6A:
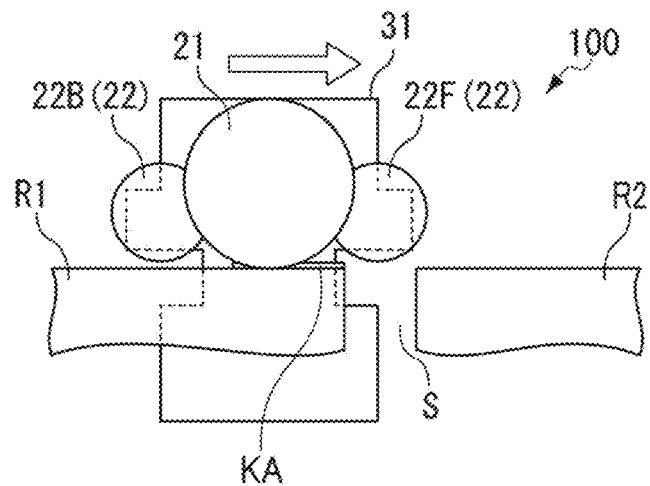
FIG. 6A is a diagram illustrating the operation when the overhead transport vehicle in FIG. 1 moves so as to straddle between a straight rail and an intersection rail.
Figure 6B:
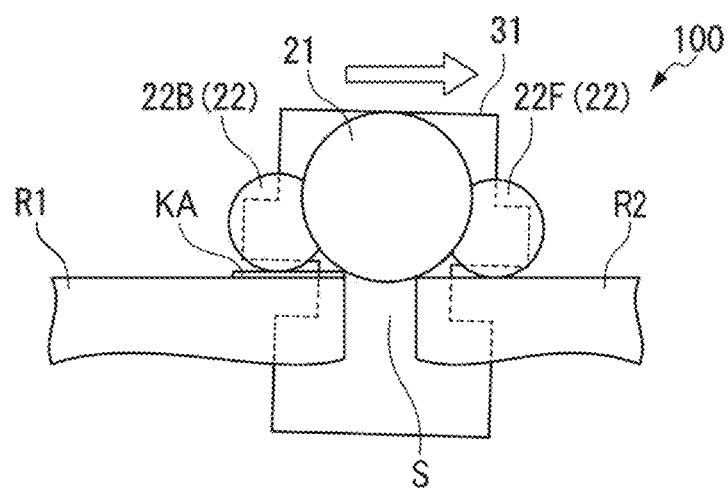
FIG. 6B is a diagram illustrating an operation state following FIG. 6A.
Figure 6C:
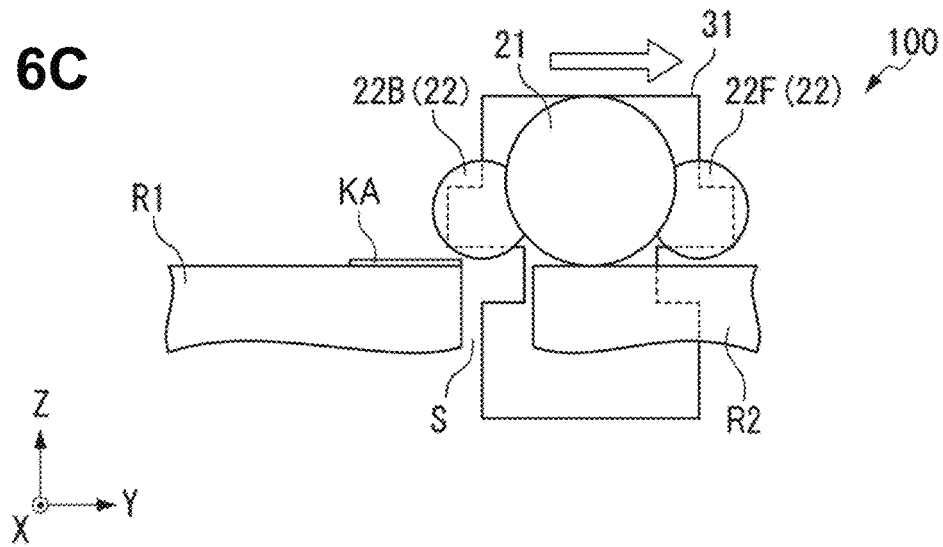
FIG. 6C is a diagram illustrating an operation state following FIG. 6B.

FIGS. 6A to 6C are diagrams illustrating the operation when the overhead transport vehicle 100 moves so as to straddle between the straight rail R1 and the intersection rail R2. As illustrated in FIGS. 6A to 6C, the end portion of the straight rail R1 is provided with the raised portion KA on which the auxiliary wheel 22 can ride. The raised portion KA is the portion that protrudes upward on the straight rail R1. The raised portion KA is formed in the outer region in the width direction of the straight rail R1 in which the traveling wheel 21 does not come into contact and only the auxiliary wheel 22 does. The height of the raised portion KA is set according to the difference between the lower end of the auxiliary wheel 22 and the lower end of the traveling wheel 21. The height of the raised portion KA in this case is set lower than the gap D (see FIGS. 6A to 6C).

As illustrated in FIG. 6A, in the case in which the overhead transport vehicle 100 travels in the arrow direction from the straight rail R1 toward the intersection rail R2, when the traveling wheel 21 travels on the straight rail R1 and is in contact with the straight rail R1, the front auxiliary wheel 22F and the rear auxiliary wheel 22B are separated upward from the straight rail R1 by the gap D (see FIGS. 6A to 6C). At this time, although the front auxiliary wheel 22F is approaching the gap S, because the traveling wheel 21 is in contact with the straight rail R1, the front auxiliary wheel 22F is held above the gap S. Therefore, even when the front auxiliary wheel 22F reaches the gap S, no vibration or the like occurs in the body section 10.

Subsequently, as illustrated in FIG. 6B, when the traveling wheel 21 reaches the gap S from the straight rail R1, the front auxiliary wheel 22F is placed on the intersection rail R2 and the rear auxiliary wheel 22B is placed on the raised portion KA of the straight rail R1. Accordingly, even when the traveling wheel 21 enters the gap S, the amount of the traveling wheel 21 falling into the gap S is suppressed, so that the vertical movement of the traveling wheel 21 is reduced and the vibration exerted on the body section 10 (transport container M) is reduced or prevented.

Then, as illustrated in FIG. 6C, the traveling wheel 21 moves from the gap S to the intersection rail R2, and the rear auxiliary wheel 22B approaches the gap S from the straight rail R1. At this time, because the amount of the traveling wheel 21 falling into the gap S is suppressed, the amount of rise when the traveling wheel 21 exits the gap S is also reduced, thereby reducing or preventing the vibration exerted on the body section 10. Furthermore, the rear auxiliary wheel 22B reaches the gap S, but is held above the gap S as the traveling wheel 21 is in contact with the intersection rail R2. Therefore, even when the rear auxiliary wheel 22B reaches the gap S, no vibration or the like occurs in the body section 10. Thus, even when the traveling wheel 21 passes through the gap S, by reducing the vertical movement of the traveling wheel 21, the vibration exerted on the body section 10 can be reduced or prevented. As a result, damage and the like to the transport container M and the contents in the transport container M can be prevented.

Next, the steering control will be explained.

Figure 7:
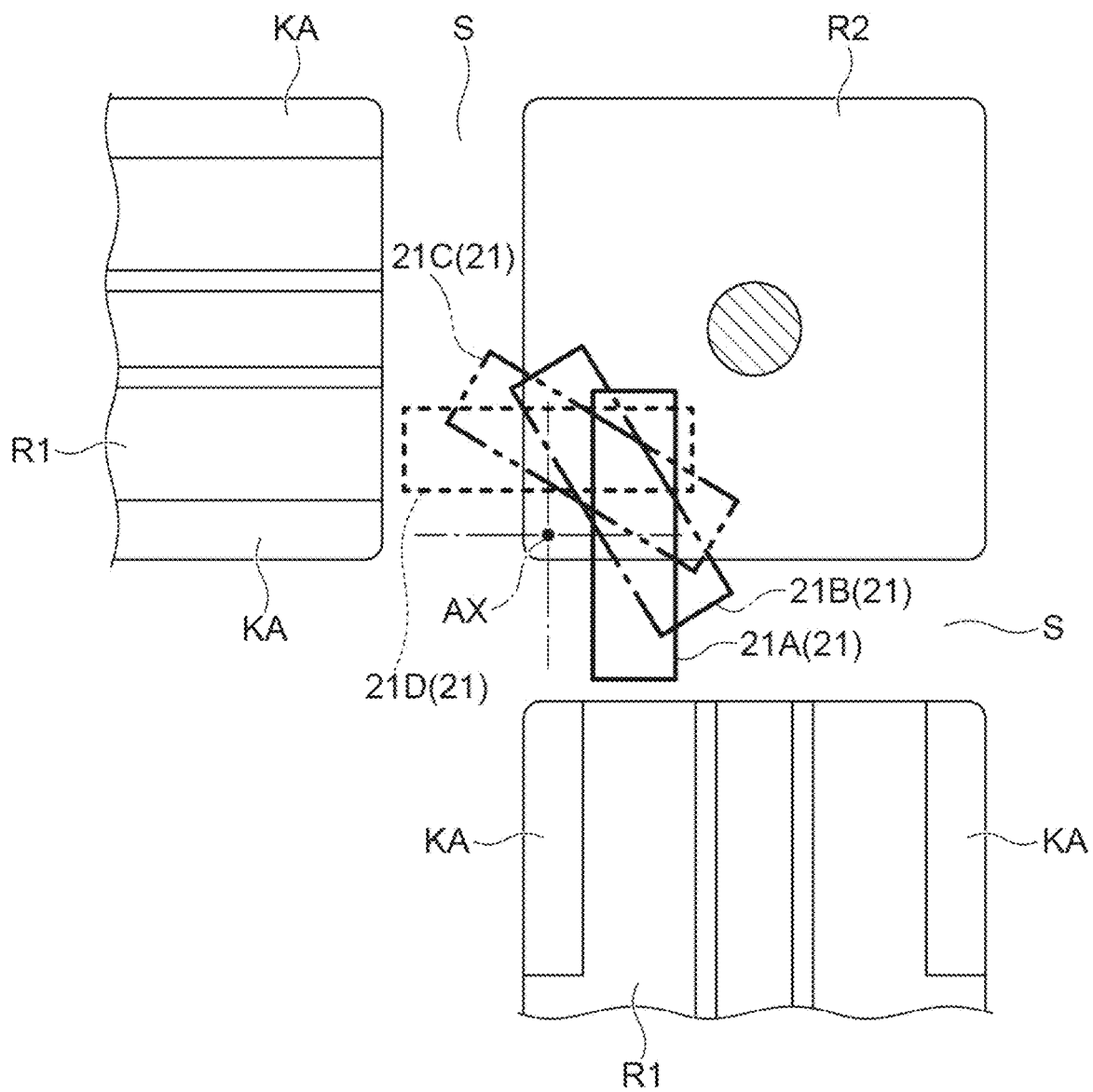
FIG. 7 is a plan view explaining the traveling wheel in steering control.

FIG. 7 is a plan view explaining the traveling wheel 21 under the steering control. FIGS. 8A, 8B, 9A, 9B, and FIG. 10 are perspective views explaining the traveling wheel 21 and the auxiliary wheels 22 under the steering control. As illustrated in FIG. 7, the pivot axis AX, which serves as the steering center of the traveling wheel 21 under the steering control, is provided so as to be positioned inward the body section 10 from the ground contact point of the traveling wheel 21 on the intersection rail R2. This allows the overhead transport vehicle 100, during steering operation, to change the direction of the traveling wheel 21 by 90° without rolling the traveling wheel 21 so as to straddle the gap S between the straight rail R1 and the intersection rail R2. The following provides a specific explanation.

Figure 8B:
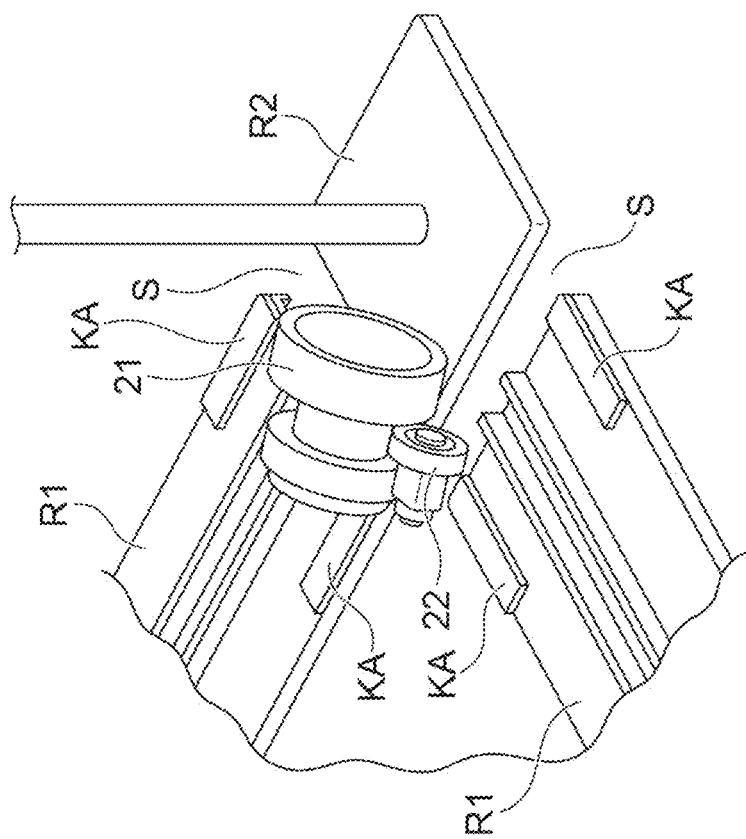
FIG. 8B is a perspective view illustrating an operation state following FIG. 8A.
Figure 8A:
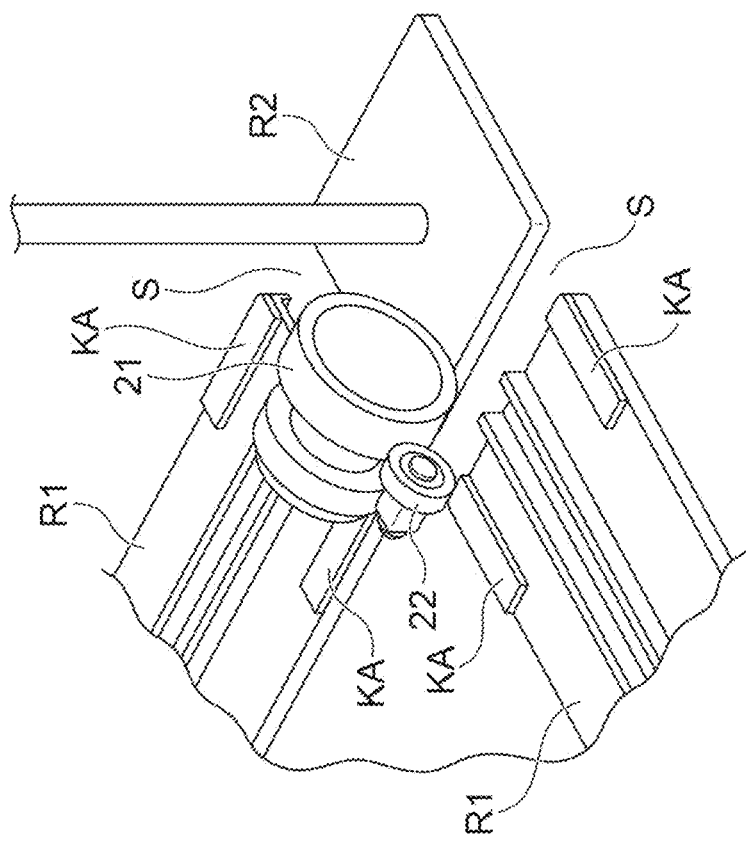
FIG. 8A is a perspective view explaining the traveling wheel and auxiliary wheels under the steering control.

First, before starting the steering control, as illustrated in FIG. 8A, the control unit 40 stops the overhead transport vehicle 100 in a state in which each of the four traveling wheels 21 is positioned on one of the intersection rails R2 different from one another. The traveling wheel 21 at this time (traveling wheel 21A in FIG. 7) is in contact with the intersection rail R2, and the auxiliary wheels 22 are positioned deviating from the raised portion KA (not riding on the raised portion KA). The pivot axis AX, which serves as the steering center, is present at an inner corner on the intersection rail R2 and is positioned inward from the ground contact point of the traveling wheel 21. The relevant ground contact point is the location on the intersection rail R2 where the traveling wheel 21 is grounded (comes into contact) and may be a single point on the intersection rail R2, a certain area on the intersection rail R2, or a straight portion on the intersection rail R2.

Subsequently, the control unit 40 starts the steering control. In the steering control, the pivoting drive unit 34 is driven to swivel the coupling section 30, and each of the traveling wheel 21 and the auxiliary wheels 22 arranged at the four corners of the body section 10 is steered by 90° in the θZ direction around the pivot axis AX. The steering operations of the traveling wheels 21 and the auxiliary wheels 22 positioned at the four corners may be performed at the same timing or performed at different timings.

FIG. 8B illustrates a state in which the traveling wheel 21 and the auxiliary wheels 22 are steered about 30° counterclockwise around the pivot axis AX from the state in FIG. 8A. In the state illustrated in FIG. 8B, as the steering center is present inward from the traveling wheel 21 on the intersection rail R2, the traveling wheel 21 (traveling wheel 21B in FIG. 7) rolls while swiveling on the intersection rail R2 and does not come off the intersection rail R2 nor fall into the gap S. The auxiliary wheels 22 swivel without contacting the raised portion KA of the straight rail R1 nor the intersection rail R2.

Figure 9A:
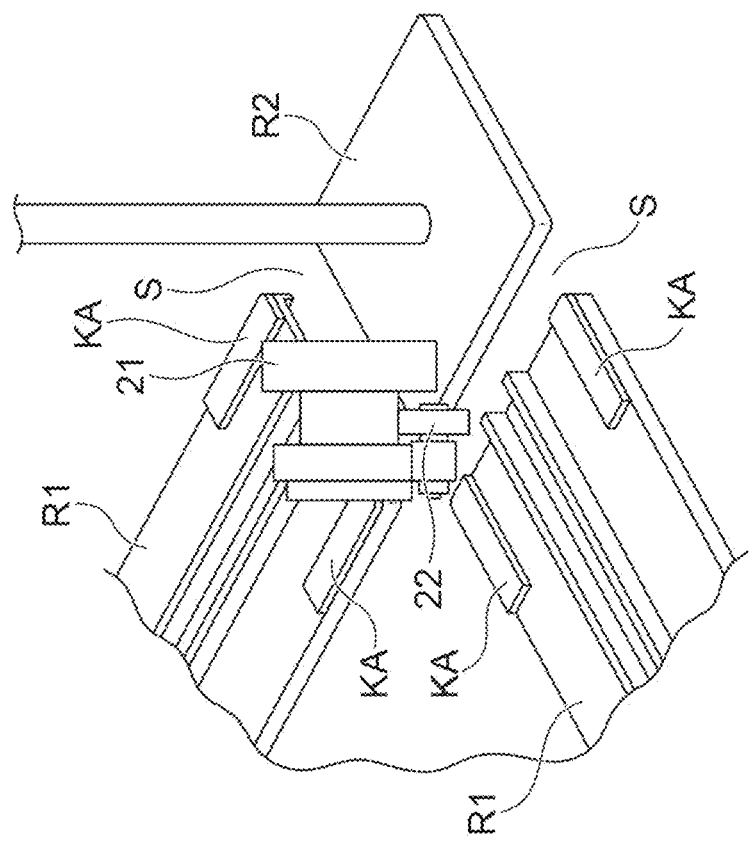
FIG. 9A is a perspective view illustrating an operation state following FIG. 8B.

FIG. 9A illustrates a state in which the traveling wheel 21 and the auxiliary wheels 22 are steered about 45° counterclockwise around the pivot axis AX from the state in FIG. 8A. In the state illustrated in FIG. 9A, as with the state illustrated in FIG. 8B, the traveling wheel 21 rolls while swiveling on the intersection rail R2 and does not come off the intersection rail R2 nor fall into the gap S. The auxiliary wheels 22 swivel without contacting the raised portion KA of the straight rail R1 nor the intersection rail R2.

Figure 9B:
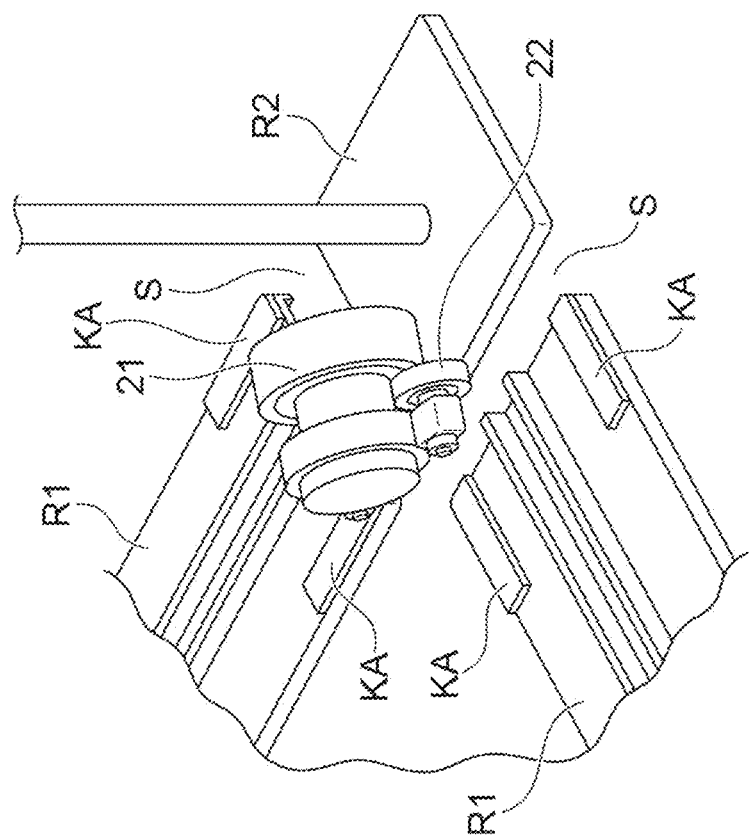
FIG. 9B is a perspective view illustrating an operation state following FIG. 9A.

FIG. 9B illustrates a state in which the traveling wheel 21 and the auxiliary wheels 22 are steered about 60° counterclockwise around the pivot axis AX from the state in FIG. 8A. In the state illustrated in FIG. 9B, as with the state illustrated in FIG. 8B, the traveling wheel 21 (traveling wheel 21C in FIG. 7) rolls while swiveling on the intersection rail R2 and does not come off the intersection rail R2 nor fall into the gap S. The auxiliary wheels 22 swivel without contacting the raised portion KA of the straight rail R1 nor the intersection rail R2.

Figure 10:
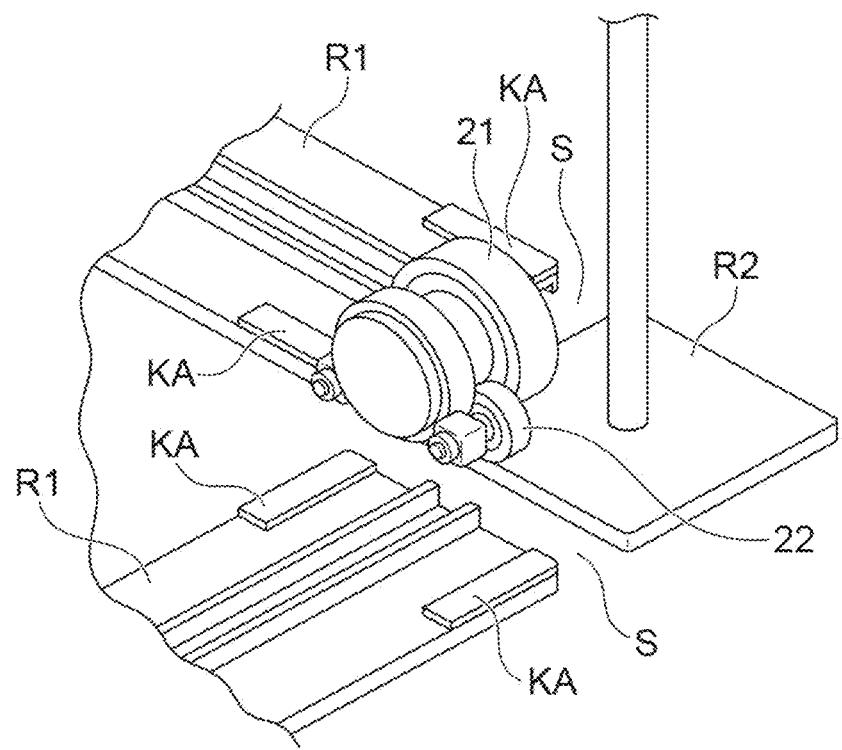
FIG. 10 is a perspective view illustrating an operation state following FIG. 9B.

FIG. 10 illustrates a state in which the traveling wheel 21 and the auxiliary wheels 22 are steered about 90° counterclockwise in the θZ direction around the pivot axis AX from the state in FIG. 8A. In the state illustrated in FIG. 10, as with the state illustrated in FIG. 8B, the traveling wheel 21 (traveling wheel 21D in FIG. 7) rolls while swiveling on the intersection rail R2 and does not come off the intersection rail R2 nor fall into the gap S. The auxiliary wheels 22 swivel without contacting the raised portion KA of the straight rail R1 nor the intersection rail R2. As in the foregoing, the overhead transport vehicle 100 can change the traveling direction thereof between the X direction and the Y direction. Because the body section 10 does not swivel during steering operation, the orientation of the body section 10 when the overhead transport vehicle 100 travels in one of the X direction and the Y direction is the same as that of when the overhead transport vehicle 100 travels in the other of the X direction and the Y direction.

As in the foregoing, in the overhead transport system SYS, during steering operation of the traveling wheel 21, it is no longer needed to roll the traveling wheel 21 so as to straddle (ride over) the gap S between the straight rail R1 and the intersection rail R2, and the traveling wheel 21 does not fall into the gap S. Thus, the vibration of the traveling wheel 21 during steering operation can be reduced or prevented. In addition, during steering operation, a large torque for the traveling wheel 21 to straddle the gap S is no longer needed, and the motor load of the drive source 35 can be reduced.

In the overhead transport system SYS, the traveling unit 20 includes the auxiliary wheels 22 arranged on the front side and the rear side in the traveling direction with respect to the traveling wheel 21. In this configuration, when the overhead transport vehicle 100 travels linearly in the X direction or the Y direction along the rails R, the traveling wheel 21 can be restrained from falling into the gap by the auxiliary wheels 22, and vibration can be reduced or prevented.

In the overhead transport system SYS, the lower end of the auxiliary wheel 22 is positioned at a higher position relative to the lower end of the traveling wheel 21 by the gap D. At the end portion of the straight rail R1, the raised portion KA on which the auxiliary wheel 22 can ride and that has a height corresponding to the gap D is provided. In this configuration, when the overhead transport vehicle 100 travels linearly in the X direction or the Y direction along the rails R, while the traveling wheel 21 is prevented from falling into the gap S by the auxiliary wheels 22 and the raised portion KA, the auxiliary wheels 22 are prevented from contacting the rail R and the raised portion KA when the traveling wheel 21 is in contact with the rail R, and thus wearing of the auxiliary wheel 22 can be reduced or prevented. The generation of particles can be reduced or prevented.

In the overhead transport system SYS, during the execution of steering control, the auxiliary wheels 22 are positioned at positions deviating from the raised portion KA. In this configuration, the auxiliary wheels 22 do not come into contact with the raised portion KA during steering operation, and wearing of the auxiliary wheels 22 can be reduced or prevented.

In the overhead transport system SYS, during steering operation, because the pivot axis AX, which is the steering center, is away inward from the ground contact point of the traveling wheel 21, the traveling wheel 21 is not steered stationarily, and damage to the traveling wheel 21 can be reduced. In the overhead transport system SYS, in travel time during which the overhead transport vehicle 100 travels in the X direction or the Y direction immediately after steering, the traveling wheel 21 rolls over the gap S so as to straddle the gap S, but on this occasion, the auxiliary wheels 22 can prevent the traveling wheel 21 from falling into the gap S, and vibration can be reduced or prevented.

As in the foregoing, preferred embodiments have been described, but the present invention is not limited to the above-described preferred embodiments.

In the above-described preferred embodiments, the two traveling wheels 21 have been used as the driving wheels, but the present invention is not limited thereto. For example, three or all of the traveling wheels 21 may be the driving wheels, or only one traveling wheel 21 may be the driving wheel. In the above-described preferred embodiments, it is not limited to providing a drive source 35 for each of the two traveling wheels 21 that are the driving wheels. For example, it may be in a configuration in which the driving force from one drive source 35 is transmitted to two traveling wheels 21.

In the above-described preferred embodiments, the auxiliary wheels 22 have been arranged on the front side and the rear side in the traveling direction with respect to each of the traveling wheels 21, but each auxiliary wheel 22 may be arranged on at least one of the front side and the rear side in the traveling direction with respect to each of the traveling wheels 21, or in some cases, the auxiliary wheels 22 may be not provided. In the above-described preferred embodiments, a configuration in which the auxiliary wheels 22 rotate has been described as an example, but the configuration is not limited thereto. For example, the auxiliary wheels 22 may be configured to slide without rotating.

In the above-described preferred embodiments, the layout of the straight rails R1 and the intersection rails R2 is not particularly limited, and various layouts may be used. In the above-described preferred embodiments, the lower end of the auxiliary wheel 22 is positioned at a higher position than the lower end of the traveling wheel 21, but the present invention is not limited thereto, and the lower end of the auxiliary wheel 22 and the lower end of the traveling wheel 21 may be positioned at the same height.

In the above-described preferred embodiments, a configuration in which the body section 10 fits within one section of the grid-shaped rails R in plan view has been described as an example, but the present invention is not limited thereto. For example, the body section 10 may be formed in dimensions greater than one section of the rails R in plan view, or may be in a shape partially protruding with respect to one section of the rails R.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport system comprising:
   an overhead transport vehicle including a conveyor to travel on rails arranged at least partially in a grid pattern, and a body suspended from the conveyor to hold articles below the rails; and
   a controller configured or programmed to control operations of the overhead transport vehicle; wherein
   the conveyor includes wheels each being steerable at each of four corners of the body;
   the rails include a plurality of straight rails and a plurality of intersection rails;
   the straight rails and the intersection rails are alternately arranged with a gap in each of a first direction and a second direction perpendicular to the first direction;
   the controller is configured or programmed to execute steering control to steer the wheels in a state in which each of the wheels is positioned on one of the intersection rails different from one another; and
   a steering center of the wheel under the steering control is on the intersection rail and inward of the body from a ground contact point of the wheel on the intersection rail.

2. The overhead transport system according to claim 1, wherein the conveyor includes an auxiliary wheel on at least one of a front side and a rear side in a traveling direction with respect to each of the wheels.

3. The overhead transport system according to claim 2, wherein
   a lower end of the auxiliary wheel is at a higher position than a lower end of the wheel; and
   an end portion of the straight rail includes a raised portion on which the auxiliary wheel is able to ride and that has a height corresponding to a difference between the lower end of the auxiliary wheel and the lower end of the wheel.

4. The overhead transport system according to claim 3, wherein the auxiliary wheel at a position deviated from the raised portion during execution of the steering control.

5. The overhead transport system according to claim 1, wherein the controller is configured or programmed to execute the steering control to steer the wheels only when each of the wheels is positioned on one of the intersection rails.

* * * * *